United States Patent [19]

Nishimura et al.

[11] Patent Number: 5,010,376
[45] Date of Patent: Apr. 23, 1991

[54] LIGHT EMITTING HETEROJUNCTION SEMICONDUCTOR DEVICE

[75] Inventors: Kohsuke Nishimura; Kazuo Sakai, both of Tokyo, Japan

[73] Assignee: Kokusai Denshin Denwa Co., Ltd., Tokyo, Japan

[21] Appl. No.: 560,692

[22] Filed: Jul. 31, 1990

[30] Foreign Application Priority Data

Sep. 1, 1989 [JP] Japan ................................ 1-224712

[51] Int. Cl.⁵ ........................................... H01L 27/14
[52] U.S. Cl. ...................................... 357/17; 357/4; 357/16; 372/43; 372/44; 372/45
[58] Field of Search ............... 357/17, 16, 4; 372/7, 372/43, 45, 44

[56] References Cited

U.S. PATENT DOCUMENTS 4,573,161  2/1986  Sakai et al. ........................ 372/45
4,819,058  4/1989  Nishizawa ......................... 357/17

FOREIGN PATENT DOCUMENTS 59-201476  11/1984  Japan ................................ 357/17
1293589    11/1989  Japan ................................ 357/17
1296687    11/1989  Japan ................................ 372/43

Primary Examiner—William Mintel
Attorney, Agent, or Firm—Armstrong, Nikaido, Marmelstein, Kubovcik & Murray

[57] ABSTRACT

A light emitting semiconductor device which emits blue and/or green light has an active layer and a pair of clad layers which sandwich the active layer (3), deposited on a substrate (1). The substrate (1) is made of GaAs, InP, GaAsP or Ge. Said active layer (3) and said clad layers (2, 4) are made of II-VI group compound semiconductor which is lattice-matched with the substrate at both room temperature and growing temperature, for instance 500° C. Said II-VI group compound semiconductor has the same linear thermal expansion coefficient as that of the substrate. The linear thermal expansion coefficient of the II-IV group compound semiconductor is adjusted by additive of Cd, Mg or Hg.

13 Claims, 5 Drawing Sheets

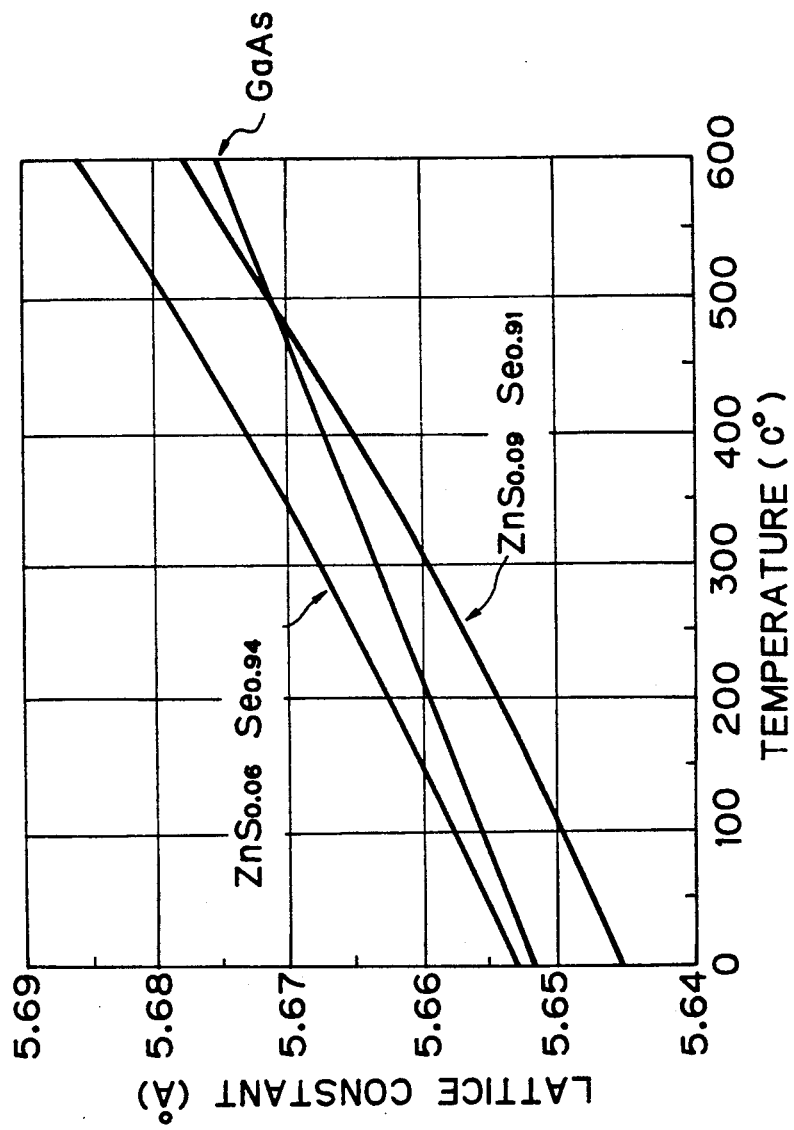

LIGHT EMITTING HETEROJUNCTION SEMICONDUCTOR DEVICE

BACKGROUND OF THE INVENTION

The present invention relates to a light emitting semiconductor element for emitting green or blue light.

Optical information technology has lately developed very rapidly with the increased production of laser discs and/or laser printers. Those devices have a semiconductor laser which emits red light as a light source. In order to achieve high density recording and/or high speed printing, the light source must be not only of a high power, but also short in wavelength. Although a short wavelength semiconductor has been proposed, no semiconductor laser which emits green or blue light (wavelength is 0.3–0.6 micron) has yet been obtained. Additionally, a blue light emitting diode is necessary for providing full color display by using light emitting diodes, however, no such diode has been obtained.

As for a short wavelength light emitting semiconductor element, in particular, green and/or blue light, because of the large energy gap of direct transition, the II-VI group compound semiconductor like ZnS, ZnSe is promising.

Further, it is recognized that Zn type II-VI group compound semiconductor is useful as a secondary harmonics generator element, and/or an optical flip-flop, and a new function element in general.

FIG. 4 shows the relations between the energy gap (horizontal axis) and the lattice constant (vertical axis) of II-VI group compound semiconductor (ZnS, ZnSe, CdS, CdSe, ZnTe, CdTe), III-V group compound semiconductor (GaAs, GaP, InP), and IV group semiconductor (Ge).

However, the Zn type II-VI group compound semiconductor has the disadvantage that no excellent crystal grows on a III-V group compound semiconductor substrate (for instance GaAs). The reason of that is that the growing layer is distorted due to the temperature change, because of the difference of the linear thermal expansion coefficient between the growing layer and the substrate.

FIG. 5 shows the relations between the temperature and the lattice constant of a prior compound semiconductor, in which the characteristics of $ZnS_{0.06}Se_{0.94}$ (atomic ratio) which lattic-matches with GaAs substrate at room temperature, $ZnS_{0.09}Se_{0.91}$ which lattice matches with GaAs substrate at 500° C., and GaAs are shown. It is noted in the figure that $ZnS_{0.06}Se_{0.94}$ which lattice matches with GaAs at room temperature, does not lattice match with the active layer and the clad layers at 500° C., and the lattice mismatching error is 0.13% at 500° C., which is the typical growing temperature. Therefore, if $ZnS_{0.06}Se_{0.94}$ is grown on GaAs substrate at 400°–600° C., the distortion is generated in the growing process, and the lattice defect and/or the impurity diffusion from the substrate occur.

On the other hand, in case of $ZnS_{0.09}Se_{0.91}'$ although it lattice matches with GaAs substrate at the growing temperature, it does not match at room temperature, and the lattice mismatching is 0.13% at room temperature. Therefore, when the temperature is decreased, the growing layer is distorted, and the lattice defect, and/or the impurity diffusion from the substrate occur.

As mentioned above, when Zn type II-VI group compound semiconductor is grown on III-V group compound semiconductor substrate like GaAs, GaP, InP, or IV group substrate like Ge, Si, the growing layer is distorted because of the temperature change, and a poor growing layer is obtained. Thus, an excellent light emitting device for short wavelengths has not to be obtained.

SUMMARY OF THE INVENTION

It is an object, therefore, of the present invention to overcome the disadvantages and limitations of a prior light emitting semiconductor device, by providing a new and improved light emitting semiconductor device.

It is also an object of the present invention to provide a light emitting semiconductor device in which a compound semiconductor grown on a substrate lattice-matches with a substrate at both room temperature and growing temperature.

The above and other objects are attained by a light emitting semiconductor device having; a substrate made of one selected from III-V group compound semiconductor, and IV group semiconductor; an active layer (3) sandwiched by clad layers (2,4) deposited on said substrate (1); said active layer and clad layers being made of II-VI group compound semiconductor which lattice matches with the substrate, and has essentially the same linear thermal expansion coefficient as that of the substrate.

Preferably, said II-VI group compound semiconductor includes additive selected from Cd, Mg and Hg so that the linear thermal expansion coefficient of the clad layers and the active layer coincides with that of the substrate.

BRIEF DESCRIPTION OF THE DRAWINGS

The foregoing and other objects, features, and attendant advantages of the invention will be appreciated as the same become better understood by means of the following description and accompanying drawings wherein;

FIG. 5 shows curves between temperature and lattice constant of $ZnS_{0.06}Se_{0.94}$, and $ZnS_{0.09}Se_{0.91}$ which are prior compound semiconductors, and GaAs.

DESCRIPTION OF THE PREFERRED EMBODIMENTS

The embodiments of the present invention are now described.

The ratio of elements in the present specification shows atomic ratio.

For the sake of simple explanation, it is assumed that a substrate is made of GaAs, and a compound semiconductor grown on the substrate is mixed crystal of Zn type semiconductor and Cd type semiconductor.

Figure 1:
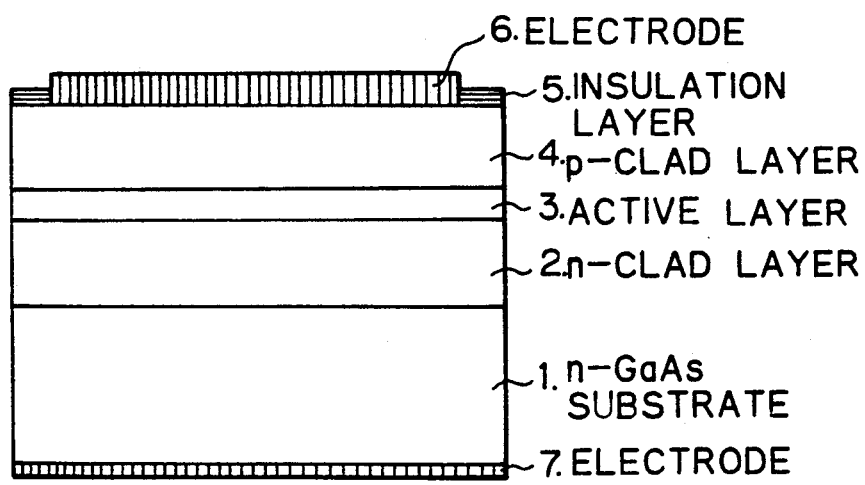
FIG. 1 shows a cross section of a light emitting semiconductor device according to the present invention.

FIG. 1 is a cross section of a light emitting semiconductor device for short wavelength light.

In the figure, the numeral 1 is a substrate made of n-GaAs, 2 is an n-side clad layer made of n-

$Cd_{0.55}Zn_{0.45}S_{0.95}Se_{0.05}$ with the thickness 2 μm, 3 is an active layer made of $Cd_{0.39}Zn_{0.61}S_{0.31}Se_{0.69}$ with the thickness 0.2 μm, 4 is a p-side clad layer made of p-$Cd_{0.55}Zn_{0.45}S_{0.95}Se_{0.05}$ with the thickness 2 μm, 5 is an insulation layer, and 6 and 7 are electrodes.

It should be appreciated that the ratio of Cd which is II group element in the II-VI group compound semiconductor is adjusted so that the expansion coefficient of the II-VI group compound semiconductor is equal to that of the substrate.

Figure 2:
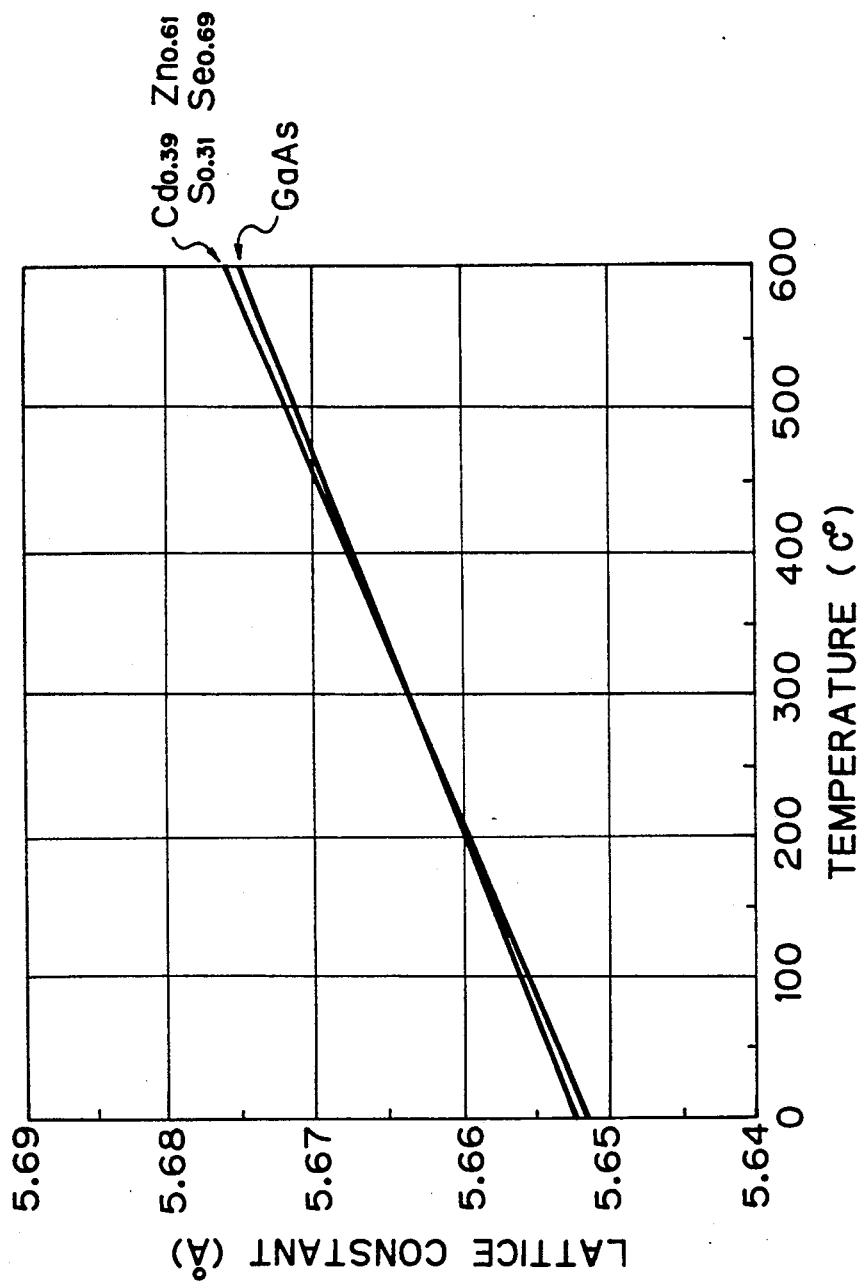
FIG. 2 shows curves between the temperature and the lattice constant of $Cd_{0.39}Zn_{0.61}S_{0.31}Se_{0.69}$ which is a semiconductor growing layer and GaAs which is a substrate, according to the present invention.

FIG. 2 shows curves of the relations between temperature and lattice constant of the compound semiconductor layer $Cd_{0.39}Zn_{0.61}S_{0.31}Se_{0.69}$, and GaAs. It should be appreciated in FIG. 2 that the $Cd_{1-x}Zn_xS_{1-y}Se_y$ which is mixed crystal of Zn type semiconductor and Cd type semiconductor lattice matches with GaAs at room temperature when $y = 1.590x - 0.666$ which is linear line is satisfied. Further, when $0.42 < x < 0.64$ is satisfied, the linear expansion coefficient of the compound semiconductor coincides with that of GaAs.

In the above structure, the lattice mismatching ratio of each of the layers is less than ±0.01% at both room temperature and growing temperature. Therefore, an excellent light emitting semiconductor which is free from distortion during temperature change is obtained for providing a short wavelength light.

In our experiment, the carrier density higher than $10^{18} cm^{-3}$ is obtained by doping I (iodine) into n-side clad layer 2, and Li (lithium) into p-side clad layer.

As described above, when a substrate is made of GaAs, the condition that the linear thermal expansion coefficient of a compound semiconductor is equal to that of a substrate is that a clad layer and an active layer have the composition $Cd_{1-x}Zn_xS_{1-y}Se_y$ ($y = 1.590x - 0.666$, $0.42 < x < 0.64$).

When a substrate is made of Ge, said condition is that a clad layer and an active layer are made of $Cd_{1-x}Zn_xS_{1-y}Se_y$ ($y = 1.592x - 0.679$, $0.56 < x < 0.78$).

When a substrate is made of InP, said condition is that a clad layer and an active layer are $Cd_{1-x}Zn_xS_{1-y}Se_y$ ($y = 1.679x + 0.159$, $0.10 < x < 0.31$).

When a substrate is made of GaP, the lattice matching both at room temperature and at growing temperature with $Cd_{1-x}Zn_xS_{1-y}Se_y$ is impossible, since the expansion coefficient of GaP is relatively small, and the lattice constant of GaP is close to ZnS which has large linear thermal expansion coefficient.

When a substrate is made of mixed crystal $GaAs_{1-z}P_z$, the lattice matching at room temperature and growing temperature is possible on the condition that $0 < z < 0.5$.

When a growing layer is made of $Cd_{1-x}Zn_xS_{1-y-z}Se_yTe_z$ which is one of II-VI group compound semiconductors, the condition for the lattice matching with a substrate at room temperature and growing temperature is as follows.

(1) When a substrate is made of InP; $0.14 < x < 1.0$, $0.0 < y < 0.76$, $0.0 < z < 0.58$
(2) When a substrate is made of GaAs; $0.44 < x < 1.0$, $0.0 < y < 0.35$, $0.0 < z < 0.36$
(3) When a substrate is made of Ge; $0.58 < x < 1.0$, $0.17 < y < 0.29$, $0.0 < z < 0.62$ The first embodiment shows a double hetero structure.

The second embodiment concerns a super lattice structure in which at least one of a clad layer and an active layer has a plurality of laminated ultra-thin films, each of which have the thickness less than 300 Å.

Figure 3:
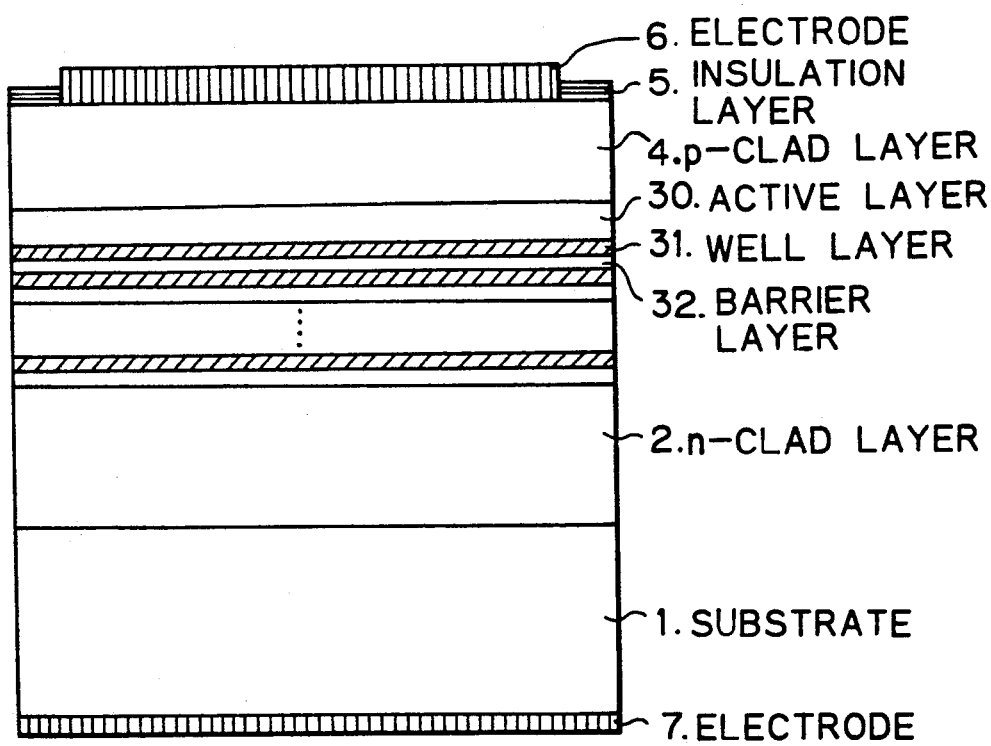
FIG. 3 is a cross section of a super lattice structure type light emitting semiconductor device.
Figure 4:
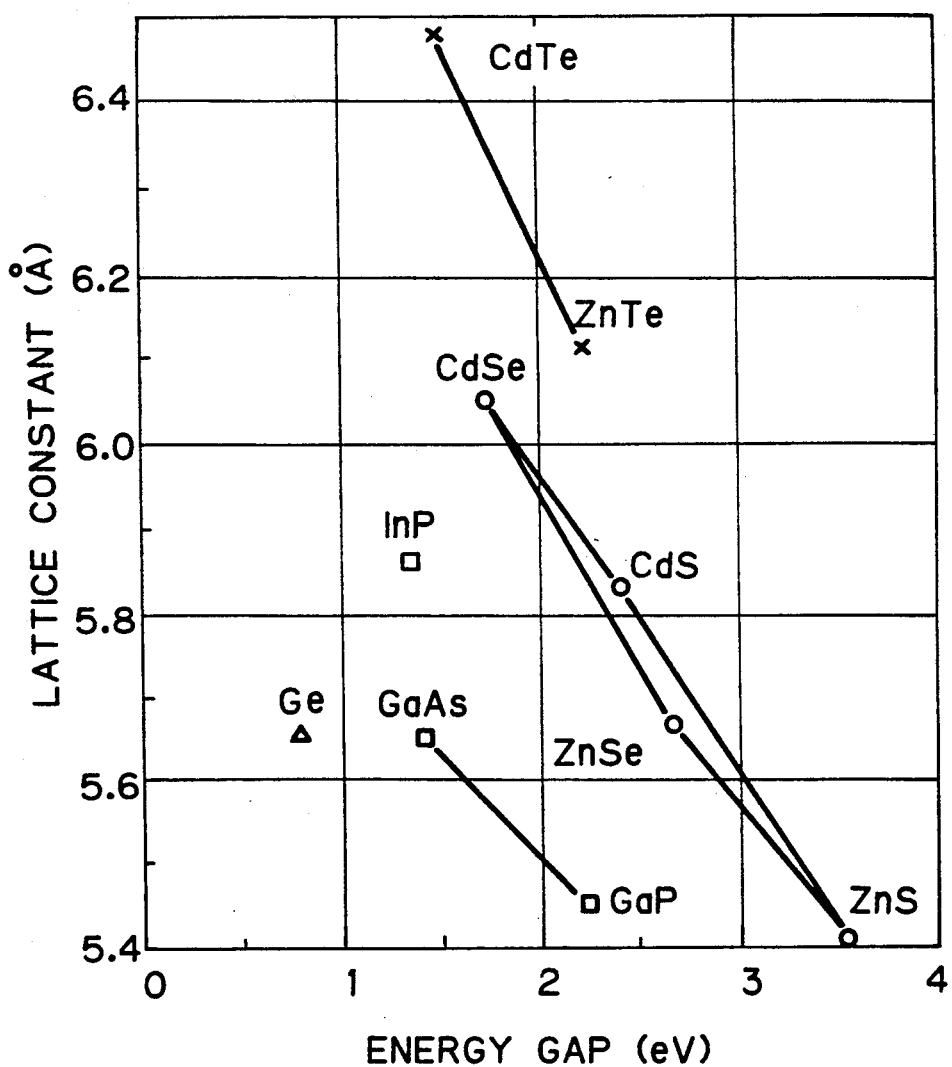
FIG. 4 shows curves between energy gap and lattice constant of some prior elements and prior compound semiconductor.

FIG. 3 shows a cross section of the second embodiment of the present invention, in which only an active layer 30 has a super lattice structure. As shown in the figure, the active layer 30 comprises a well layer 31 which is made of $Cd_{0.39}Zn_{0.61}S_{0.31}Se_{0.69}$, and a barrier layer 32 made of $Cd_{0.55}Zn_{0.39}S_{0.95}Se_{0.05}$. A plurality set of those layers 31 and 32 are laminated as shown in the figure. When the active layer 30 is in a super lattice structure, the quantum well laser characteristics are obtained. Although the above embodiments show the examples of CdZnSSe and CdZnSSeTe as II-VI group compound semiconductor, the present invention is not restricted to those examples, and an other II-VI group compound semiconductor is possible. For instance, one of Cd, Mg and Hg which belong to II group elements is useful to adjust the linear thermal expansion coefficient.

The present invention is summarized as follows.

A compound semiconductor $Cd_{1-x}Zn_xS_{1-y}Se_y$ lattice matches with a substrate GaAs, having the same linear thermal expansion coefficient as that of the latter.

When a compound semiconductor has the composition $Cd_{1-x}Zn_xS_{1-y-z}Se_yTe_z$, the attainable range of energy gap is larger than that of the above composition. The latter lattice matches also with a substrate of GaAs, and has the same linear thermal expansion coefficient as that of GaAs.

When a substrate is made of III-V group compound semiconductor selected from GaAs, InP, GaAsP, the substrate lattice matches with a compound semiconductor layer deposited on the substrate.

When a substrate is made of a IV group element, like Ge, the substrate lattice matches with the compound semiconductor deposited on the substrate.

The linear thermal expansion coefficient is adjusted by II group element selected from Cd, Mg and Hg.

The present invention is useful for generating short wavelength light at room temperature, for an optical flip-flop, and/or a bury structure of III-V group or IV group waveguide.

From the foregoing it will now be apparent that a new and improved light emitting semiconductor device has been found. It should be understood of course that the embodiments disclosed are merely illustrative and are not intended to limit the scope of the invention. Reference should be made to the appended claims therefore rather than the specification as indicating the scope of the invention.

What is claimed is:
1. A light emitting semiconductor device comprising;
a substrate made of one selected from III-V group compound semiconductor, and group IV semiconductor,
an active layer (3) sandwiched by clad layers (2,4) deposited on said substrate (1),
said active layer and clad layers being made of group II-VI compound semiconductor which lattice matches with the substrate, and has essentially the same linear thermal expansion coefficient as that of the substrate.

2. A light emitting semiconductor device according to claim 1, wherein said group II-VI compound semiconductor includes an additive selected from Cd, Mg and Hg.

3. A light emitting semiconductor device according to claim 2, wherein said group II-VI compound semiconductor has the composition $Cd_{1-x}Zn_xS_{1-y}Se_y$.

4. A light emitting semiconductor device according to claim 3, wherein the substrate is made of GaAs, and $y=1.590x-0.666$, and $0.42<x<0.64$ are satisfied.

5. A light emitting semiconductor device according to claim 3, wherein the substrate is made of Ge, and $y=1.592x-0.679$ and $0.56<x<0.78$ are satisfied.

6. A light emitting semiconductor device according to claim 3, wherein the substrate is made of InP, and $y=1.679+0.159$, and $0.10<x<0.31$ are satisfied.

7. A light emitting semiconductor device according to claim 1, wherein said group II-VI compound semiconductor has the composition $Cd_{1-x}Zn_xS_{1-y-z}Se_yTe_z$.

8. A light emitting semiconductor device according to claim 7, wherein the substrate is made of InP, and $0.14<x<1.0$, $0.0<y<0.76$, and $0.0<z<0.58$ are satisfied.

9. A light emitting semiconductor device according to claim 7, wherein the substrate is made of GaAs, and $0.44<x<1.0$, $0.0<y<0.35$, and $0.0<z<0.36$ are satisfied.

10. A light emitting semiconductor device according to claim 7, wherein the substrate is made of Ge, and $0.58<x<1.0$, $0.17<y<0.29$ and $0.0<z<0.62$ are satisfied.

11. A light emitting semiconductor device according to claim 1, wherein said active layer has a super lattice structure.

12. A light emitting semiconductor device according to claim 1, wherein said group III-V semiconductor substrate is one selected from GaAs, InP and GaAsP.

13. A light emitting semiconductor device according to claim 1, wherein said group IV substrate is Ge.

* * * * *